US008277889B2

(12) United States Patent
Gomi et al.

(10) Patent No.: US 8,277,889 B2
(45) Date of Patent: Oct. 2, 2012

(54) FILM FORMATION METHOD AND FILM FORMATION APPARATUS

(75) Inventors: Atsushi Gomi, Nirasaki (JP); Yasushi Mizusawa, Albany, NY (US); Tatsuo Hatano, Nirasaki (JP); Masamichi Hara, Nirasaki (JP); Osamu Yokoyama, Nirasaki (JP); Satoshi Taga, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 673 days.

(21) Appl. No.: 12/443,487

(22) PCT Filed: Feb. 19, 2008

(86) PCT No.: PCT/JP2008/052757
§ 371 (c)(1),
(2), (4) Date: Mar. 30, 2009

(87) PCT Pub. No.: WO2008/117590
PCT Pub. Date: Oct. 2, 2008

(65) Prior Publication Data
US 2010/0075035 A1    Mar. 25, 2010

(30) Foreign Application Priority Data

Mar. 28, 2007    (JP) ................................. 2007-085022

(51) Int. Cl.
*C23C 16/04* (2006.01)
*C23C 16/16* (2006.01)
*C23C 16/46* (2006.01)

(52) U.S. Cl. ........ 427/252; 118/725; 118/721; 118/720; 118/504

(58) Field of Classification Search ............... 427/248.1, 427/250, 252; 118/504, 720, 724, 725
See application file for complete search history.

(56) References Cited

U.S. PATENT DOCUMENTS

| 5,766,363 | A | * | 6/1998 | Mizuno et al. | 118/725 |
| 5,855,687 | A | | 1/1999 | DuBois et al. | |
| 6,221,166 | B1 | * | 4/2001 | Nguyen et al. | 118/725 |
| 7,270,848 | B2 | * | 9/2007 | Suzuki et al. | 427/250 |
| 7,763,311 | B2 | * | 7/2010 | Suzuki | 427/96.8 |
| 7,794,788 | B2 | * | 9/2010 | Suzuki | 427/255.28 |
| 7,858,522 | B2 | * | 12/2010 | Suzuki et al. | 438/681 |
| 7,892,358 | B2 | * | 2/2011 | Suzuki et al. | 118/715 |
| 2005/0196534 | A1 | | 9/2005 | Hatano et al. | |
| 2007/0231489 | A1 | * | 10/2007 | Suzuki et al. | 427/255.28 |
| 2007/0232040 | A1 | * | 10/2007 | Suzuki et al. | 438/584 |
| 2007/0234955 | A1 | * | 10/2007 | Suzuki et al. | 118/715 |
| 2008/0241380 | A1 | * | 10/2008 | Suzuki | 427/255.28 |

FOREIGN PATENT DOCUMENTS

| JP | 4 3926 | 1/1992 |
| JP | 8 85875 | 4/1996 |
| JP | 8 255760 | 10/1996 |
| JP | 2004 156104 | 6/2004 |
| JP | 2006 274316 | 10/2006 |

* cited by examiner

*Primary Examiner* — Jason L. Lazorcik
(74) *Attorney, Agent, or Firm* — Oblon, Spivak, McClelland, Maier & Neustadt, L.L.P.

(57) ABSTRACT

A film formation method is disclosed for depositing a metal film on a target substrate by supplying a metal carbonyl source in gas phase to a surface of the target substrate and decomposing the source near the surface of the target substrate. The method includes a step of preferentially decomposing the metal carbonyl source in an area near the outer peripheral portion of the target substrate when the metal film is being deposited on the surface of the target substrate. As a result, a CO concentration in the atmosphere is increased locally near the outer peripheral portion of the target substrate and the depositing of the metal film on the outer peripheral portion is better controlled.

4 Claims, 6 Drawing Sheets

T3 > T1 > T2 ≧ T4

T3 > T1 > T2 (≧ T4)

T5 > T3 > T1 > T2

T1 > T2

FILM FORMATION METHOD AND FILM FORMATION APPARATUS

TECHNICAL FIELD

The present invention generally relates to a film forming technique, and more specifically to a film formation method of forming a conductive film by CVD (Chemical Vapor Deposition) method and a film formation apparatus of the same.

A technique of forming a film is basic and important in manufacturing a semiconductor device.

When a semiconductor device is manufactured, a semiconductor film and an insulation film have been formed usually by the CVD (Chemical Vapor Deposition) method. On the other hand, when a wiring layer is formed on a semiconductor layer, a process such as sputtering is widely used.

However, in recent hyperfine semiconductor integrated circuits, a multi-layered wiring structure having wiring patterns made of low-resistance metal is being employed to mutually electronically connect a large number of semiconductor devices formed on the substrate. The damascene method or the dual damascene method is widely used especially in a multi-layered wiring having a wiring layer made of Cu. In the methods, the wiring grooves and via holes are previously formed in a silicon dioxide film or an interlayer insulating layer made of low relative permittivity so-called low-dielectric constant (low-K) source and are filled with a Cu layer. Then, the extra part of the Cu film is removed by Chemical Mechanical Polishing (CMP).

In the damascene method and the dual damascene method, the surfaces of the wiring grooves and the via holes formed in the interlayer insulating film are typically coated with a barrier metal film made of high-melting-point metal such as Ta, and a thin Cu seed layer is further formed on the barrier metal film by the PVD method or the CVD method. Then, electrolytic plating is performed by using the Cu seed layer as an electrode so that the wiring grooves and via holes are filled with the Cu layer.

With recent miniaturization of semiconductor integrated circuits, the diameter of the via plug has been reduced to a range from 65 nm to 45 nm. In the near future, it is expected that the diameter of the via plug will be further reduced to a range from 32 nm to 22 nm.

Due to the fine shape of the via holes and wiring grooves resulting from the miniaturization of semiconductor integrated circuits, it becomes difficult, from the step-coverage point of view, to form the barrier metal layer and the Cu seed layer based on the conventional PVD method. To solve the problem, techniques are being researched based on an MOCVD method or an ALD method capable of realizing an excellent step coverage at a lower temperature so that the interlayer insulating layer made of a low-K source is not damaged.

On the other hand, in the damascene method and the dual damascene method, after the barrier metal film and the Cu seed film are deposited, the Cu film is deposited on the entire surface of the substrate by electrolytic plating. Then, in the CMP step, the deposited Cu film and the Cu seed film are removed except the Cu layer placed in the wiring grooves and via holes by electrolytic plating. However, unfortunately, in the CMP method, it is not possible to remove the Cu film and the Cu seed film deposited on a side edge of the substrate (bevel portion). The metal film remaining in the substrate bevel portion as described above may be easily peeled off due to contact or an impact when the substrate is handled, so that the peeled-off part of the metal film becomes a main particle source.

To avoid the problem, when the Cu seed layer and the Cu film are formed by the PVD method or the electrolytic plating method, a clamp mechanism has been conventionally used which clam mechanism covers the edge portion of the substrate to control the deposit of the Cu film on the edge portion and the rear surface of the substrate.

DISCLOSURE OF INVENTION

Problems to be Solved by the Invention

However, as described above, when the Cu seed film is formed by the MOCVD method or the ALD method, the step coverage is remarkably improved compared with that in the PVD method. Because of this feature, it becomes difficult to control the deposit of the Cu seed film on the side edge of the substrate when the MOCVD method or the ALD method is used.

The present invention is made in light of the above problems and may provide a film forming technique for forming a metal film using a vapor-phase source and capable of controlling the deposit of the metal film on the outer peripheral portion of the semiconductor substrate.

Means for Solving the Problems

According to an aspect of the present invention, there is provided a film formation method for depositing a metal film on a target substrate by supplying a metal carbonyl source in gas phase to a surface of the target substrate and decomposing the source near the surface of the target substrate. The method includes a step of preferentially decomposing the metal carbonyl source in an area near the outer peripheral portion of the target substrate when the metal film is being deposited on the surface of the target substrate. As a result, a CO concentration in atmosphere is increased locally near the outer peripheral portion of the target substrate, and the deposit of the metal film on the outer peripheral portion is better controlled.

According to another aspect of the present invention, there is provided a film formation apparatus including a processing container having a substrate holder for supporting a target substrate; an evacuation system for evacuating the processing container; a first gas supply system for supplying a gas of metal carbonyl source to the processing container; and a second gas supply system for supplying a gas for controlling the decomposition of the metal carbonyl source in the processing container. Further, the substrate holder has sizes corresponding to an outer diameter of the target substrate and includes a supporting section for sustaining the target substrate and a temperature control section contiguously surrounding the supporting section, and the temperature control section is maintained at a temperature higher than that of the supporting section when the metal film is being formed on the target substrate by the decomposition of the metal carbonyl source.

ADVANTAGEOUS EFFECT OF THE INVENTION

According to an embodiment of the present invention, when a metal film is being deposited on a surface of a target substrate using a metal carbonyl source, the CO concentration in the atmosphere in an outer peripheral portion nearby area of the target substrate is locally increased by accelerating the separation of the metal carbonyl source in the outer peripheral portion nearby area, thereby reliably and efficiently controlling the deposit of the metal film on the outer peripheral portion of the target substrate.

BEST MODE FOR CARRYING OUT THE INVENTION

Figure 1:
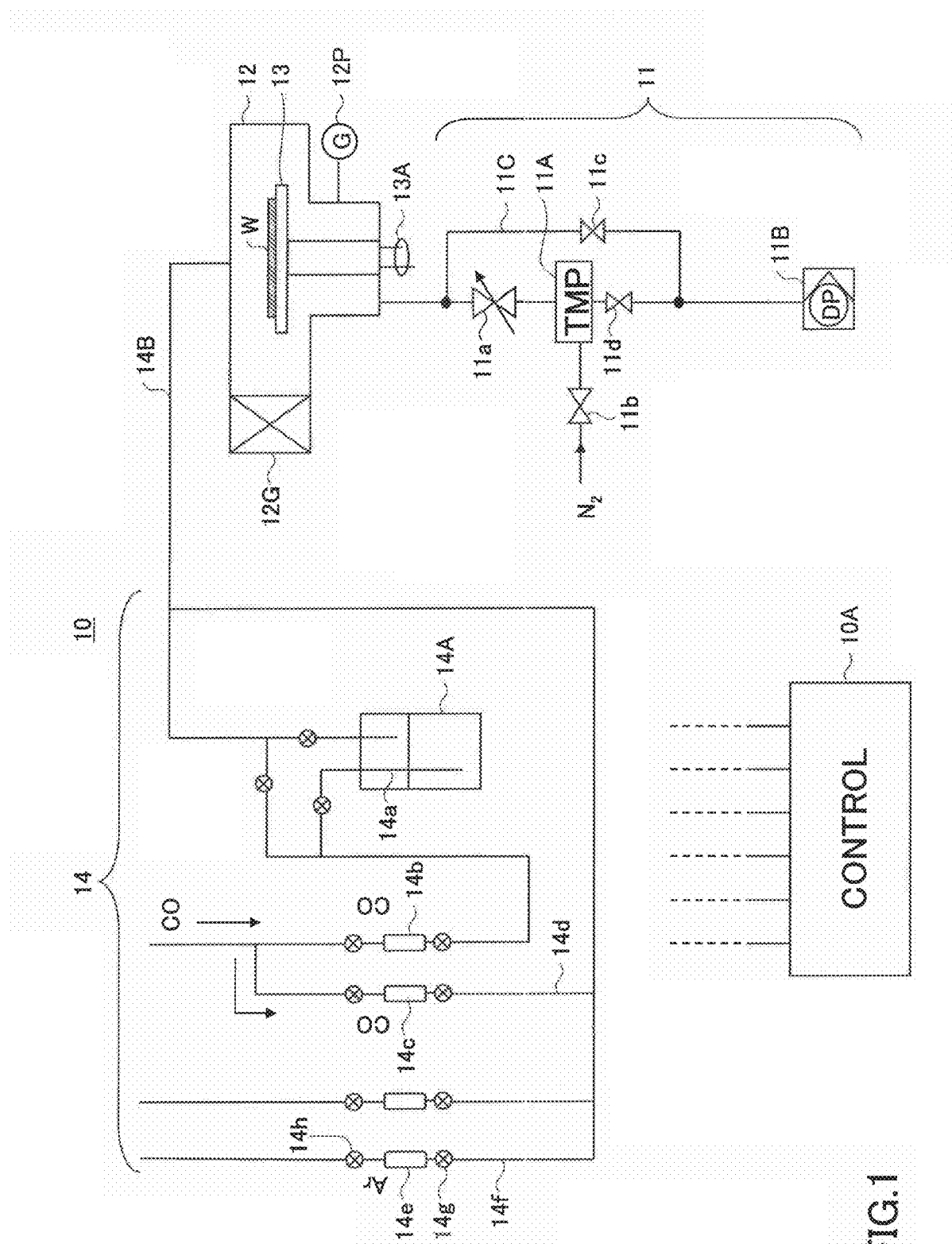
FIG. 1 is a drawing showing a general outline of a film formation apparatus according to an embodiment of the present invention.

FIG. 1 shows a configuration of a film formation apparatus 10 according to an embodiment of the present invention.

As shown in FIG. 1, the film formation apparatus 10 includes a processing container 12 and an evacuation system 11 for evacuating the processing container 12. The processing container 12 includes a substrate holder 13 for holding a target substrate "W" and a gate bulb 12G formed on the processing container 12 for putting in and taking out the target substrate "W".

The substrate holder 13 includes a built-in heater to maintain the target substrate "W" at a desired temperature by driving the heater through a drive line 13A.

The evacuation system 11 includes a turbo molecular pump 11A and a dry pump 11B in series. Nitrogen gas is supplied to the turbo molecular pump 11A through a bulb 11b.

A variable conductance valve 11a is between the processing container 12 and the turbo molecular pump 11A to maintain the entire pressure in the processing container 12 at a constant pressure. Further, in the film formation apparatus 1, an evacuation route 11C as a bypass of the turbo molecular pump 11A is provided so that the processing container 12 is roughly pumped by the dry pump 11B. A valve 11c is for the evacuation route 11C, and another valve 11d is on the downstream side of the turbo molecular pump 11A.

A source in a gas phase for forming a film is supplied from a source supply system 14 including a bubbler 14A to the processing container 12 through a gas introduction line 14B.

In the example of the figure, $Ru_3(CO)_{12}$, which is a Ru-carbonyl compound, is stored in the bubbler 14A. CO gas is supplied as bubbling gas to the bubbler 14A through a bubbling gas line 14a on which an MFC (Mass Flow Controller) 14b is provided. As a result, evaporated $Ru_3(CO)_{12}$ along with CO carrier gas through a line 14d on which a line MFC 14c is provided are supplied to the processing container 12 through the gas introduction line 14B.

Further, the source supply system 14 of the configuration in FIG. 1 includes a line 14f on which valves 14g and 14h and an MFC 14e are provided and that supplies inert gas, such as Ar, to be added to the $Ru_3(CO)_{12}$ source gas to be supplied to the processing container 12 through the line 14B.

Further, the film formation apparatus 10 includes a control device 10A for controlling the processing container 12, the evacuation system 11, and the source supply system 14.

Figure 2:
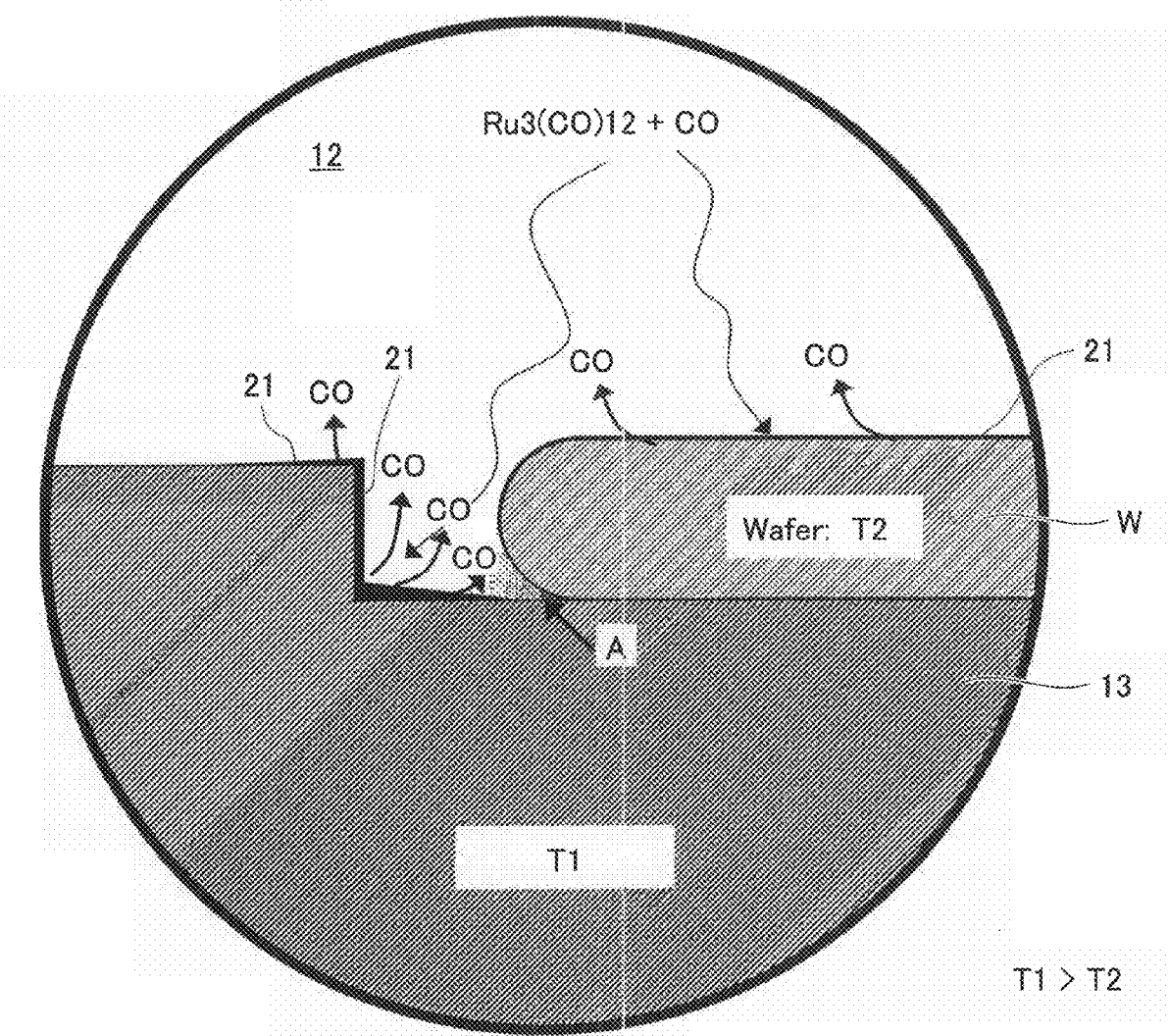
FIG. 2 is a drawing illustrating a principle of the present invention.

FIG. 2 is a drawing showing where a Ru film is deposited on a wafer "W" supported on the substrate holder 13. More specifically, FIG. 2 shows an edge portion of the wafer "W" in detail.

As shown in FIG. 2, the wafer "W" is positioned in a concave portion formed on a surface of the substrate holder 13 shown in FIG. 1 in a manner so that a rounded edge portion of the wafer "W" faces and is separated from a side wall surface of the concave portion by a slight distance of, for example, 0.5 mm to 1 mm.

In the film formation apparatus 10 of FIG. 1, the gas-phase source of $Ru_3(CO)_{12}$ bubbled in the bubbler 14A by the CO gas through the line 14a are combined with high-concentration CO carrier gas through the line 14d, and the combined gas is supplied to the processing container 12. On the surface of the target substrate "W", the source of $Ru_3(CO)_{12}$ is decomposed by releasing CO and a metal Ru film 21 is deposited on the wafer "W" in accordance with the following reaction formula:

$$Ru_3(CO)_{12} \rightarrow 3Ru + 12CO \qquad (1)$$

This reaction formula shows that the metal Ru film 21 is deposited on a surface of the substrate holder 13.

When the CO partial pressure in the atmosphere is low, the reaction in Formula (1) proceeds in the right (arrow) direction so that the separation of Ru is accelerated. On the other hand, when the CO partial pressure in the atmosphere is high, the reaction proceeding to the right is impeded. This characteristic is also applied to a case where a metal film using a metal carbonyl source such as W, Ni, Co, Rh, Re, and Cr is formed.

This characteristic shows that the reaction resulting in a deposit of the metal film using such a metal carbonyl source can be adjusted when the CO partial pressure in the atmosphere can be adjusted. To make use of this characteristic, in the film formation apparatus 10 in FIG. 1, CO gas is used as the carrier gas to increase the CO partial pressure while the metal carbonyl source is being transferred, thereby better controlling the separation of the metal carbonyl source and the deposit of the metal film in its flow path.

The deposit and separation from the $Ru_3(CO)_{12}$ source as shown in the above Formula (1) may also occur in the processing container 12 including a peripheral portion of the wafer "W" on the substrate holder 13. The inventors of the present invention have discovered in fundamental research of the present invention that, in an area along the peripheral portion of the wafer in the concave portion formed on the surface of the substrate holder 13 as shown in FIG. 2, when the distance between the peripheral portion of the wafer and an inner wall of the concave portion is adequate, the released CO gas from the decomposition of $Ru_3(CO)_{12}$ accumulates, and the CO concentration is locally increased; accordingly, the formation of the Ru film is controlled especially on the inclined slope on the lower side of the peripheral portion of the target substrate as pointed to by an arrow "A".

The present invention is made based on the discovered fact and may provide a film formation apparatus and a film formation method capable of reliably controlling the depositing of the metal film on the peripheral portion of the wafer when a metal film is being formed on the wafer by the decomposition of the metal carbonyl source.

Figure 3:
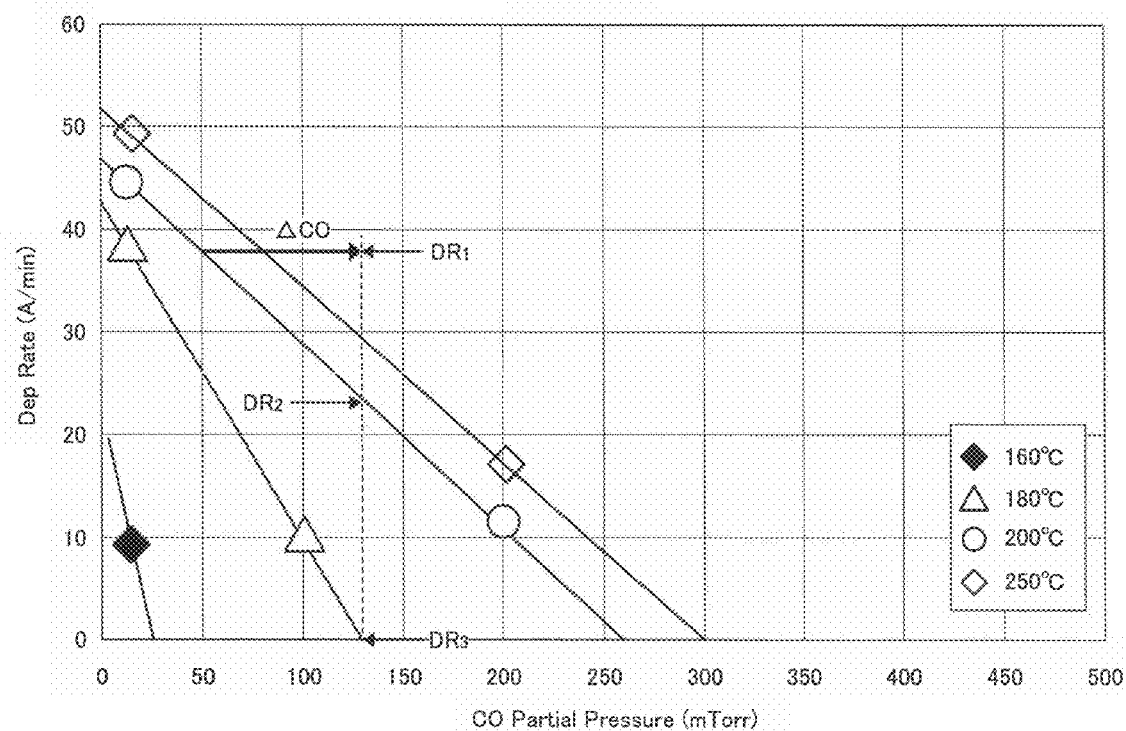
FIG. 3 is another drawing illustrating a principle of the present invention.

FIG. 3 shows the relationships between the deposition rate of the Ru film formed by the decomposition of such a $Ru_3(CO)_{12}$ source and the CO partial pressure in atmosphere when the substrate temperatures are 160° C., 180° C., 200° C., and 250° C. as a result of the fundamental research of the present invention.

As shown in FIG. 3, at each substrate temperature, the Ru deposit starts when the CO partial pressure is low, and the lower the CO partial pressure becomes, the more the deposition rate of the Ru film increases.

For example, at 180° C. of the substrate temperature, when the CO partial pressure in the atmosphere is equal to or greater than 130 Pa, the Ru film is not formed (value of the deposition rate is zero); and, on the other hand, when the CO partial pressure in atmosphere is less than 130 Pa, the film forming process starts to deposit the Ru film at a finite deposition rate.

Further, as the relationships in FIG. 3 show, at 50 mTorr of the CO partial pressure, when the temperature is 200° C., the Ru film is deposited at a first deposition rate "DR1" which is approximately 3.9 nm/minute. In this case, when the free diffusion of the CO gas released by the above reaction is impeded, as shown by the bold arrow, the CO partial pressure increases locally near the portion where the Ru film is formed. For example, the CO partial pressure is locally increased to approximately 130 mTorr, the deposition rate of the metal Ru film according to Formula (1) decreases to a second deposition rate "DR2" which is approximately 2.4 nm/minute at the same temperature of 200° C.

Further, in the atmosphere where the CO partial pressure is locally increased to approximately 130 mTorr, when the temperature of the wafer is maintained at a lower temperature, for example 180° C., as shown in FIG. 3, the deposition rate "R3" of the metal Ru film according to Formula (1) becomes zero, thereby controlling the depositing of the metal Ru film on the wafer.

Therefore, according to an embodiment of the present invention, there is provided a structure capable of controlling the free diffusion of the CO gas released as a reaction product when the metal Ru film is bing deposited according to Formula (1) along the peripheral portion of the target substrate that is the wafer. Further, the temperature of the structure is set higher than that of the wafer, thereby controlling the depositing of the metal film on the peripheral portion of the wafer.

[First Embodiment]

Figure 4:
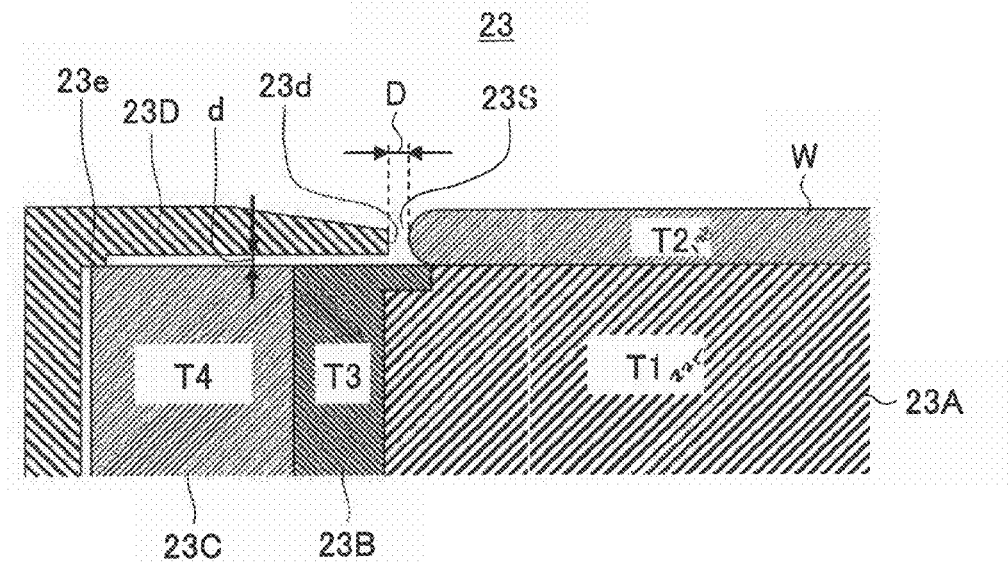
FIG. 4 is a drawing showing a general outline of a substrate holder used in a film formation apparatus according to a first embodiment of the present invention.

FIG. 4 schematically shows a configuration of a substrate holder 23 according to a first embodiment of the present invention used in the film formation apparatus 10 in FIG. 1.

As shown in FIG. 4, the substrate holder 23 includes a supporting section 23A having substantially the same diameter of the wafer "W" to sustain the wafer "W" and a ring-shaped temperature control section 23B outside and in contact with the supporting section 23A. The supporting section 23A is heated to the temperature of "T1" by a first heater (not shown) buried in the supporting section 23A. The temperature control section 23B is heated to the temperature of "T3" which is higher than that of "T1" (T1<T3) by a second heater (not shown).

Further, outside of the temperature control section 23B, an outer peripheral member 23C is formed so as to constitute an outer peripheral portion of the substrate holder 23. Still further, outside of the outer peripheral member 23C, a cover ring 23D is provided in a manner so that the cover ring covers the side wall surface and the upper surface of the outer peripheral member 23C and the most of the upper surface of the temperature control section 23B.

At the inner side end portion of the cover ring 23D, an inner wall surface 23d is formed. The inner wall surface 23d faces the side wall surface of the wafer "W" and is separated from the outer peripheral surface of the wafer "W" by a distance "D" of 0.5 mm, and has a height of, for example, 1 mm. As a result, a small space 23S having a ratio of height to width (aspect ratio) of approximately 2 and in communication with a process space above the wafer "W" is formed between the outer peripheral surface of the wafer "W" and the cover ring 23D.

Further, the cover ring 23D includes a member 23e engaged with the upper surface of the outer peripheral member 23C, so that a gap "d" having a size from 0.05 mm to 0.5 mm is formed between the upper surface of the outer peripheral member 23C and the bottom surface of the cover ring 23D.

In this configuration, the wafer "W" supported on the supporting section 23A having a temperature of "T1" is maintained at the temperature of "T2" which is lower than that of "T1" because heat of the wafer "W" is transferred to the process space. On the other hand, as described above, the temperature control section 23B is maintained at the temperature of "T3" which is higher than that of "T1". As a result, the relationships among the temperatures "T1", "T2", and "T3" are expressed by the inequality T3>T1>T2.

It should be noted that the outer peripheral member 23C is at the temperature of "T4" (T4≦T2) which is lower that that of "T1" heated by a third heater (not shown) buried in outer peripheral member 23C, which assists in ensuring that the temperature control section 23B is maintained at the desired high temperature "T3" by the second heater.

For example, when the temperature "T1" of the supporting section 23A is 225° C., the temperature "T2" of the wafer "W" is maintained at 198° C.

Now, referring to the relationships in FIG. 3, when the temperature of the temperature control section 23B is, for example, 250° C. which is higher than the temperature "T1", the decomposition of the $Ru_3(CO)_{12}$ source is accelerated in the space 23S along the peripheral portion of the wafer "W", and the diffusion of the CO released as the reaction product of the decomposition is impeded. As a result, the CO partial pressure in the space 23S is locally increased, and accordingly, the deposit of the metal Ru film is controlled on the side wall surface of the wafer "W" maintained at the low temperature "T1".

[Second Embodiment]

Figure 5:
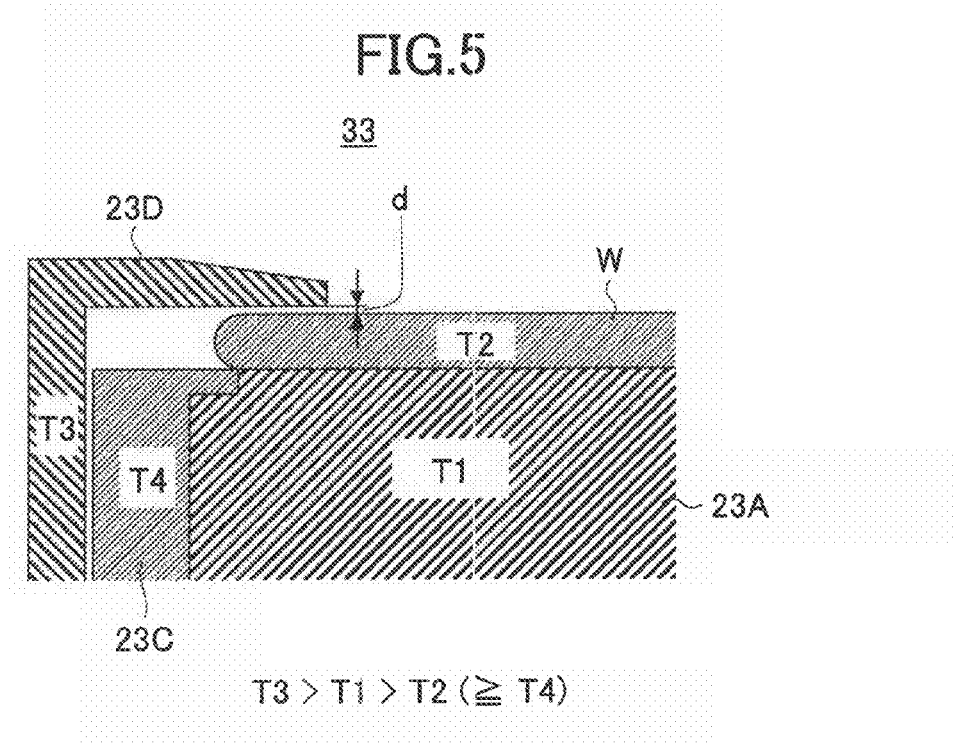
FIG. 5 is a drawing showing a general outline of a substrate holder used in a film formation apparatus according to a second embodiment of the present invention.

FIG. 5 schematically shows a configuration of a substrate holder 33 according to a second embodiment of the present invention. In the figure, the same reference numerals are used for the corresponding elements described above and the description of the elements is herein omitted.

As shown in FIG. 5, in the substrate holder 33, the temperature control section 23B is not included between the supporting section 23A and the outer peripheral member 23C, and the outer peripheral member 23C contiguously covers the outer side of the supporting section 23A.

Further, in the configuration in FIG. 5, the cover ring 23D is heated to a temperature "T3" which is higher than the temperature "T1" of the supporting section 23A by a heater (not shown) buried in the cover ring 23D.

The cover ring 23D includes its end portion which covers the peripheral portion of the upper surface of the wafer "W" in a ring shape. As a result, a space is formed having a width of "d" between the end portion and the upper surface of the wafer "W" and in communication with the process space where the wafer "W" is exposed.

Figure 6:
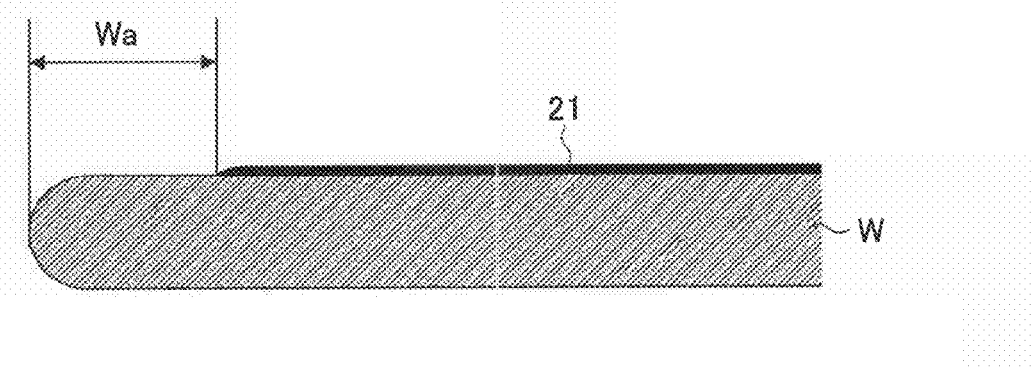
FIG. 6 is a drawing showing a wafer on which a metal film is formed in the film formation apparatus in FIG. 6.

In this configuration as well, in the wafer peripheral portion "Wa" covered by the cover ring 23D, by increasing the temperature of the surface of the cover ring 23D facing the surface of the wafer up to a temperature higher than temperature "T1" of the wafer main portion, the decomposition of the $Ru_3(CO)_{12}$ source is accelerated on the surface of the cover ring 23D, thereby locally increasing the CO concentration in the space. As a result, it becomes possible to control the depositing of the Ru film on the wafer peripheral potion "Wa" of the target wafer "W" as shown in FIG. 6.

[Third Embodiment]

Figure 7:
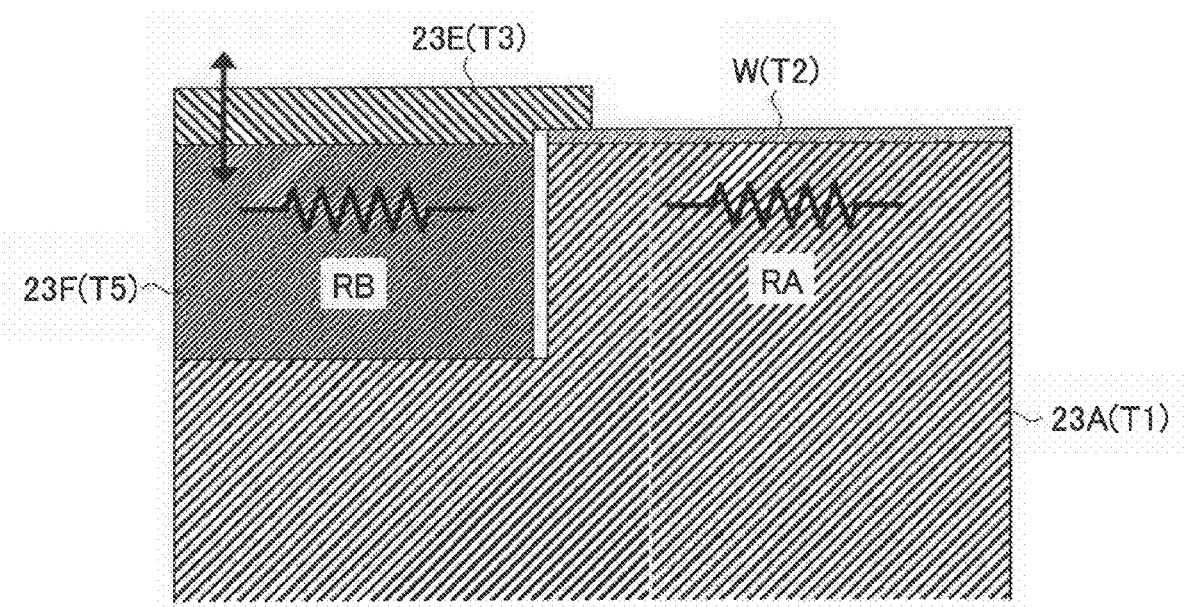
FIG. 7 is a drawing showing a general outline of a substrate holder used in a film formation apparatus according to a third embodiment of the present invention.

FIG. 7 schematically shows a configuration of a substrate holder 43 according to a third embodiment of the present invention. In the figure, the same reference numerals are used for the corresponding elements described above and the description of the elements is herein omitted.

As shown in FIG. 7, the upper surface of the wafer "W" is held by a clamp ring 23 that is movably provided in up and down directions. The clamp ring 23E is in engaged with the wafer in its lowered position as shown in FIG. 7. When the clamp ring 23E is lifted up to its higher position, the wafer "W" is released.

When the clamp ring 23E is positioned at its lowered position, the clamp ring 23E is in contact with a heat source 23F that is formed in a ring shape outside the supporting section 23A and that is maintained at the temperature "T5" by a heater RA. As a result, the clamp ring 23E is heated to the temperature "T3" (T3<T5).

Further, in the configuration in FIG. 7, the supporting section 23A is heated to the temperature "T1" (T2<T1<T3) by a heater RA.

According to the configuration, the heat source 23F may be fixed and the configuration of the clamp ring 23E may be simplified.

It should be noted that, in the configuration of FIG. 7, the clamp ring 23E may be separated from the surface of the wafer "W" when the clamp ring 23E is positioned at its lowered position. By doing this, the configuration may become substantially equal to that of FIG. 5.

[Fourth Embodiment]

Figure 8:
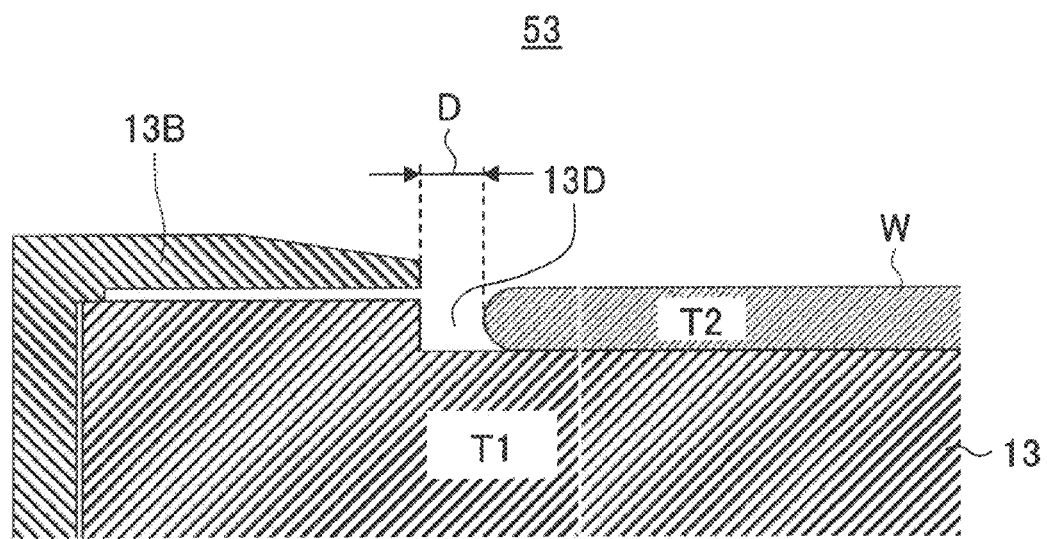
FIG. 8 is a drawing showing a general outline of a substrate holder used in a film formation apparatus according to a fourth embodiment of the present invention.

FIG. 8 schematically shows a configuration of a substrate holder 53 according to a fourth embodiment of the present invention.

As shown in FIG. 8, the configuration of the substrate holder 53 is substantially equal to that shown in FIG. 2. The wafer "W" is positioned in the concave portion formed on the substrate holder 53 in a manner so that the wafer "W" is separated from the inner wall surface of the concave portion by a distance "D" of 0.5 mm. As a result, a ring-shaped space 13D having a ratio of width to depth of approximately 2 and in communication with the process space above the wafer "W" is formed outside the peripheral portion of the wafer "W".

In the configuration of FIG. 8, there is no high temperature section in the substrate holder 53. However, by forming the ring shaped space as shown in FIG. 8, it becomes possible to control the diffusion of the CO gas released by the composition of the metal carbonyl source in this space, thereby controlling the depositing of the metal Ru film on the outer peripheral area of the wafer "W".

In each of the embodiments, an example of forming the metal Ru film from the $Ru_3(CO)_{12}$ source is described. However, the embodiments of the present invention are not limited to the specific examples described above. For example, W film, Ni film, Mo film, Co film, Rh film, Re film, and Cr film may be formed from $W(CO)_6$, $Ni(CO)_4$, $Mo(CO)_6$, $Co_2(CO)_6$, $Rh_4(CO)_{12}$, $Re_2(CO)_{10}$, and $Cr(CO)_6$, respectively, as other metal carbonyl sources within a scope of the present invention.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teachings herein set forth.

The present application is based on and claims the benefit of priority of Japanese Patent Application No. 2007-085022, filed on Mar. 28, 2007, the entire contents of which are hereby incorporated herein by reference.

The invention claimed is:

1. A film formation method for depositing a metal film on a target substrate by supplying a metal carbonyl source in a gas phase to a surface of the target substrate disposed on a substrate holder and decomposing the source before the metal carbonyl source arrives at the surface of the target substrate, the target substrate having an outer circumferential peripheral portion radially separated from an inner portion, the method comprising:
   a step of preferentially decomposing the metal carbonyl source at a greater rate in an area of an outer circumferential peripheral portion of the target substrate than in the inner portion of the target substrate by setting a temperature zone contiguously surrounding the outer circumferential peripheral portion of the substrate at a higher temperature than the substrate holder; and
   depositing the metal film on the surface of the target substrate; wherein
   a CO concentration is increased locally in an atmosphere near the outer circumferential peripheral portion of the target substrate relative to the inner portion of the target substrate, and the depositing of the metal film on the outer peripheral portion is better controlled.

2. The film formation method according to claim 1, wherein the step of preferentially decomposing the metal carbonyl source includes
   a step of increasing the temperature of the temperature zone up to a temperature higher than that of the surface of the target substrate.

3. The film formation method according to claim 2, wherein the step of increasing the temperature of the temperature zone up to a temperature higher than that of the surface of the target substrate includes
   a step of placing a cover member to cover the outer peripheral portion of the target substrate, and increasing the temperature of the cover member up to a temperature higher than that of the surface of the target substrate.

4. The film formation method according to claim 1, wherein the step of preferentially decomposing the metal carbonyl source includes
   a step of forming a second atmospheric space near the outer peripheral portion, the second atmospheric space being in communication with a first atmospheric space facing a main portion of the target substrate and having a volume smaller than that of the first atmospheric space;
   wherein the step of forming the second atmospheric space includes
   a step of placing a cover member to cover the outer peripheral portion of the target substrate.

* * * * *